(12) United States Patent
Horwath et al.

(10) Patent No.: US 11,239,579 B2
(45) Date of Patent: Feb. 1, 2022

(54) TERMINAL BLOCK AND STUD FOR TRANSITIONING AN ELECTRICAL CONNECTION BETWEEN TWO DISTINCT AREAS

(71) Applicant: Submariner Electric Motor LLC, Erie, PA (US)

(72) Inventors: Jeffrey R. Horwath, Waterford, PA (US); James A. Senkalski, Erie, PA (US)

(73) Assignee: Submariner Electric Motor LLC, Erie, PA (US)

( * ) Notice: Subject to any disclaimer, the term of this patent is extended or adjusted under 35 U.S.C. 154(b) by 31 days.

(21) Appl. No.: 16/198,241

(22) Filed: Jan. 4, 2019

(65) Prior Publication Data

US 2019/0165499 A1 May 30, 2019

Related U.S. Application Data

(60) Provisional application No. 62/592,233, filed on Nov. 29, 2017.

(51) Int. Cl.
| | |
|---|---|
| *H01R 9/24* | (2006.01) |
| *H01R 13/52* | (2006.01) |
| *H05K 5/06* | (2006.01) |
| *H01R 13/523* | (2006.01) |
| *H01R 31/06* | (2006.01) |

(Continued)

(52) U.S. Cl.
CPC ............ *H01R 9/2416* (2013.01); *H01R 9/24* (2013.01); *H01R 13/5202* (2013.01); *H01R 13/523* (2013.01); *H01R 13/5216* (2013.01); *H05K 5/065* (2013.01); *H05K 5/068* (2013.01); *H05K 5/069* (2013.01); *H01R 4/20* (2013.01);

(Continued)

(58) Field of Classification Search
CPC .... H01R 9/2416; H01R 9/24; H01R 13/5202; H01R 13/5216; H01R 13/523; H01R 4/20; H01R 31/06; H01R 2105/00; H05K 5/065; H05K 5/068; H05K 5/069
USPC ..................................... 439/709, 733.1, 271
See application file for complete search history.

(56) References Cited

U.S. PATENT DOCUMENTS

| | | | | |
|---|---|---|---|---|
| 3,500,297 | A | * 3/1970 | Georges ............... | H01R 13/426 439/737 |
| 6,699,078 | B2 | * 3/2004 | Quadir .................. | H01R 13/53 439/272 |

(Continued)

*Primary Examiner* — Marcus E Harcum
(74) *Attorney, Agent, or Firm* — Jonathan M. D'Silva; MMI Intellectual Property

(57) ABSTRACT

A terminal block for transitioning electrical connections between two adjacent areas comprises at least one hole for receiving a stud. Each hole comprises a through hole and a sealing chamber surrounding the through hole. A stud is used for each hole. Each stud comprises a seal support flange and a sealing device. Each side of the seal support flange comprises a system for making an electrical connection. The seal support flange is sized to fit within the sealing chamber. The sealing device is located between the support flange and the sealing chamber. The stud is secured to the hole on the opposite side of the dielectric insert from the support flange and the sealing chamber to compress the sealing device between the support flange and the sealing chamber and cause the sealing device to fill the space of the sealing chamber and form a seal between the stud and the sealing chamber.

11 Claims, 2 Drawing Sheets

(51) Int. Cl.
*H01R 4/20* (2006.01)
*H01R 105/00* (2006.01)
*H02G 3/22* (2006.01)

(52) U.S. Cl.
CPC .......... *H01R 31/06* (2013.01); *H01R 2105/00* (2013.01); *H02G 3/22* (2013.01)

(56) References Cited

U.S. PATENT DOCUMENTS

| | | | | |
|---|---|---|---|---|
| 7,175,481 B1* | 2/2007 | Cotton | ............... | H01R 13/5202 439/733.1 |
| 7,249,971 B2* | 7/2007 | Burke | ............... | B29C 45/14639 439/589 |
| 7,559,810 B1* | 7/2009 | Wu | ......................... | H01R 4/34 439/709 |
| 9,531,139 B2* | 12/2016 | Morita | ............... | H01R 13/5216 |
| 9,748,684 B2* | 8/2017 | Singer | .................... | H01R 13/08 |
| 2005/0186821 A1* | 8/2005 | Franks, Jr. | ......... | H01R 13/5205 439/271 |
| 2008/0233807 A1* | 9/2008 | Newton | ............... | H01R 13/745 439/709 |
| 2011/0097948 A1* | 4/2011 | Melni | ...................... | H01R 4/56 439/733.1 |
| 2011/0212640 A1* | 9/2011 | Lange | ............... | H01L 31/02008 439/271 |
| 2013/0217262 A1* | 8/2013 | Ikeda | ................... | H01R 25/162 439/559 |
| 2013/0330952 A1* | 12/2013 | Mori | .................... | H01R 13/426 439/271 |
| 2014/0045386 A1* | 2/2014 | Kimura | ................. | H01R 43/00 439/709 |
| 2014/0242838 A1* | 8/2014 | Ikezawa | ............... | H01R 13/521 439/587 |
| 2016/0149464 A1* | 5/2016 | Fan | ........................ | H02K 5/225 310/71 |
| 2016/0172784 A1* | 6/2016 | Kataoka | ............. | H01R 13/6592 439/271 |
| 2016/0204529 A1* | 7/2016 | Imai | ........................ | H01R 9/24 439/587 |

* cited by examiner

TERMINAL BLOCK AND STUD FOR TRANSITIONING AN ELECTRICAL CONNECTION BETWEEN TWO DISTINCT AREAS

BACKGROUND

It is sometimes necessary to provide electrical connections to prevent water or other fluid transfers between two adjacent but separated physical locations. For example, in underwater applications, it may be necessary to isolate the interior of a motor or engine from the water it is submerged in and maintain an electrical connection to the exterior of the motor or engine. What is presented is a device that allows for the waterproof/gasproof connection of a cable.

SUMMARY

What is presented is terminal block for transitioning an electrical connection between two distinct areas comprising a dielectric insert having at least one hole for receiving a stud. Each hole comprises a through hole and a sealing chamber that surrounds the through hole. A stud for each hole comprises a seal support flange and a sealing device. Each side of the seal support flange has an electrical connector. The seal support flange is sized to fit within the sealing chamber and the sealing device is located between the support flange and the sealing chamber.

The stud is secured to the hole on the opposite side from the support flange and the sealing chamber to compress the sealing device between the support flange and the sealing chamber. This causes the sealing device to fill the space of the sealing chamber and form a seal between the stud and the sealing chamber.

The electrical connector comprises one of a crimping cavity, a threaded end, a set screw, or a compression fit connection. The dielectric insert is made of any dielectric material such as Haysite or other epoxy impregnated fiberglass. The stud is made of an electrically conductive material such as copper or aluminum. The sealing device is made of a compressible and expandable material such as rubber, neoprene, or other elastomeric material. The stud is secured to the terminal block with a nut or a snap ring.

Those skilled in the art will realize that this invention is capable of embodiments that are different from those shown and that details of the devices and methods can be changed in various manners without departing from the scope of this invention. Accordingly, the drawings and descriptions are to be regarded as including such equivalent embodiments as do not depart from the spirit and scope of this invention.

BRIEF DESCRIPTION OF DRAWINGS

For a more complete understanding and appreciation of this invention, and its many advantages, reference will be made to the following detailed description taken in conjunction with the accompanying drawings.

DETAILED DESCRIPTION

Figure 1:
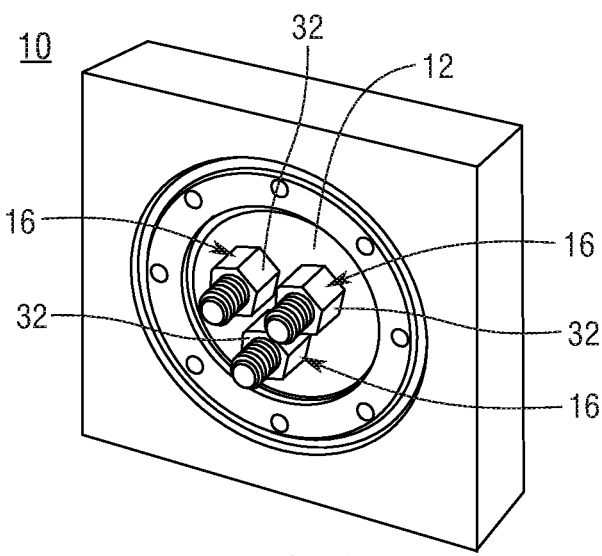
FIG. 1 is a perspective view of an embodiment of terminal block having three transitional studs.

Referring to the drawings, some of the reference numerals are used to designate the same or corresponding parts through several of the embodiments and figures shown and described. Corresponding parts are denoted in different embodiments with the addition of lowercase letters. Variations of corresponding parts in form or function that are depicted in the figures are described. It will be understood that variations in the embodiments can generally be interchanged without deviating from the invention.

A terminal block assembly designed to provide electrical connections to prevent water or other liquid transfers between two adjacent but separated physical locations is presented. The terminal block provides for an insulated electrical path thru a bulkhead or wall of a container or containers, while also preventing electrical passage to ground and isolating the circuits from each other. The passage of pressurized gasses and liquids from one side to the other is prevented. An example of this would be a sealed electric motor capable of operating under water.

Figure 2:
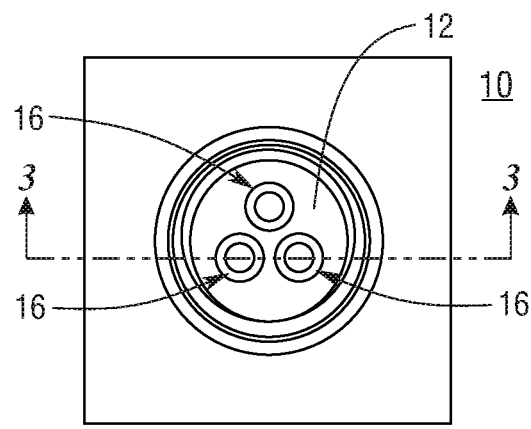
FIG. 2 is a front view of the terminal block of FIG. 1.
Figure 3:
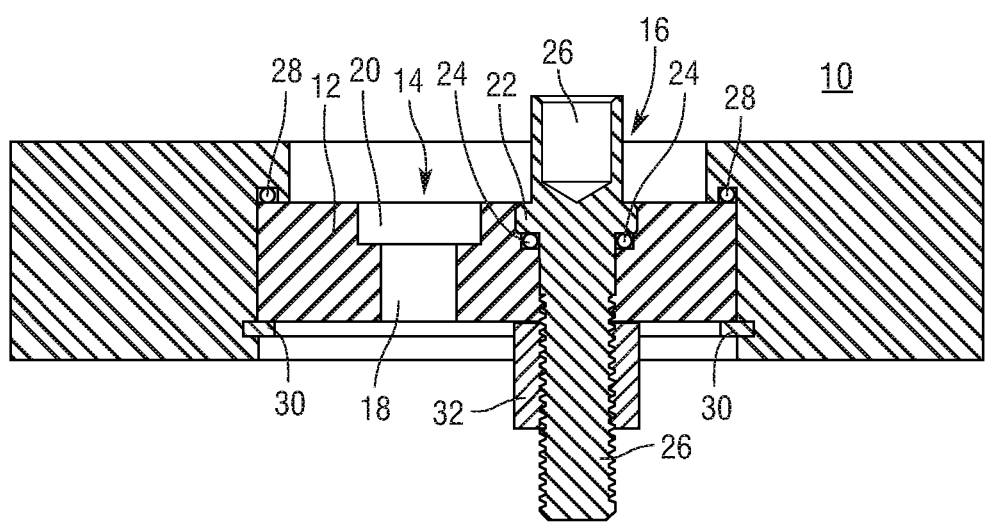
FIG. 3 is a cross sectional view the terminal block of FIG. 2 with only one stud installed in the terminal block.

As best understood by comparing FIGS. 1, 2, and 3, the terminal block 10 comprises a steel block that may be bolted in place with sealing surfaces utilizing O-ring seals, or it may be welded in place, or otherwise secured at the location where the electrical connection is required. Within the block is a dielectric insert 12. The dielectric insert 12 is a rigid non-conductive material such as Haysite™ or other epoxy impregnated fiberglass. The dielectric insert 12 is formed specifically for the terminal block 10, with at least one hole 14 to accept the conductive receiving studs 16 that facilitate electrical connections through the terminal block 10.

The number of holes 14 may be varied by the specific application with the embodiment shown in FIGS. 1-3 having three studs 16. Each hole 14 comprises a through hole 18 and a sealing chamber 20 that surrounds the through hole 18, The cross section of the terminal block in FIG. 3 shows one hole 14 with a stud 16 and one empty for purposes of illustration.

Figure 4:
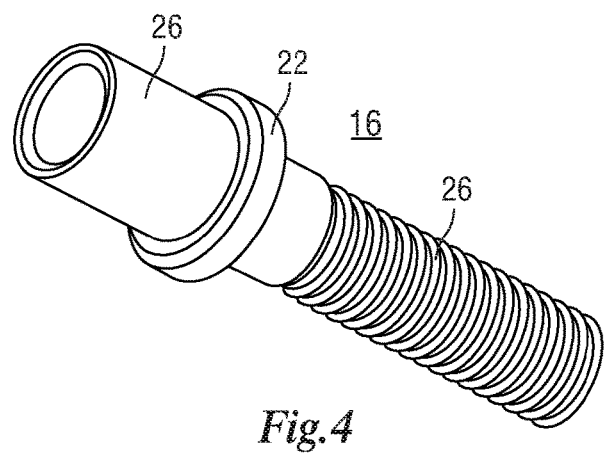
FIG. 4 is a perspective view of the stud shown in FIG. 1.
Figure 5:
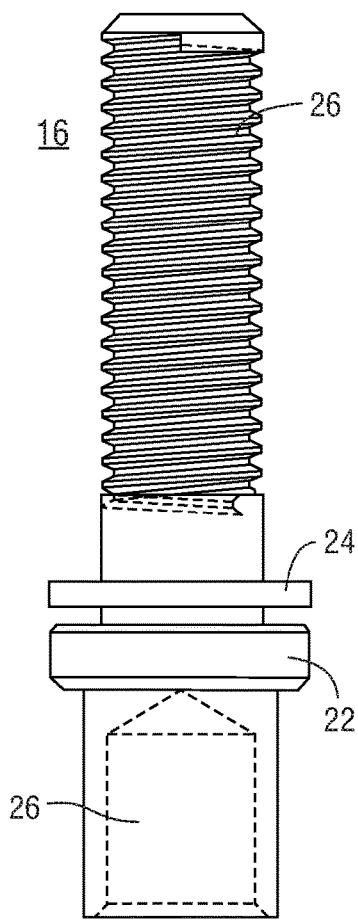
FIG. 5 is a side view of the stud of FIG. 4.

As best seen in FIGS. 3, 4, and 5, each stud 16 comprises a seal support flange 22 and a sealing device 24. On each side of the seal support flange 22 is an electrical connector 26 for connecting an electrical cable or wire. The seal support flange 22 provides a flat rib for any sealing device 24 such as a rubber washer to compress against producing a liquid or gas proof surface on the stud 16. The sealing device 24 is made of a compressible and expandable material such as rubber, neoprene, or other elastomeric material. The stud is made of an electrically conductive material such as copper or aluminum.

In the embodiment shown in FIGS. 1-5, the electrical connectors 26 of the studs 16 shown comprise a crimping cavity on one side of the seal support flange 22 and a threaded end on the other. The electrical connector 26 may be any device or combination of devices needed for the particular application to provide an electrical connection on either side of the terminal block 10, including a set screw, a compression fit connection, or any other electrical connector.

The seal support flange 22 is sized to fit within the sealing chamber 20. The sealing device 24 is positioned between the support flange 22 and the sealing chamber 20. The stud 16 is secured to the hole 14 with a nut 32 on the opposite side of the dielectric insert 12 from the support flange 22 and said sealing chamber 24 to compress the sealing device 24 between the support flange 22 and said sealing chamber 20.

This causes the sealing device 24 to fill the space of the sealing chamber 20 and form a seal between the stud 16 and the sealing chamber 20. FIGS. 1-3 show a nut 32 used to secure and compress the stud 16 to the hole 14, but it could be any other device, such as a snap ring, etc.

The dielectric insert 12 is sealed with O-rings or rubber gaskets 28, compressed with force and held in position by a snap ring 30, When assembled and installed, the terminal block 10 prevents the passage of pressurized gasses and liquids from one side to the other.

The stud 16 shown in FIGS. 1-5 has one of its electrical connectors 26 as a crimping cavity. This allows the waterproof connection of a stranded wire or cable. Inherent in any stranded wire cable are air paths and spaces that water can traverse along. The finer the wire the smaller the spaces for water to travel, however, this reduction in space increases water capillarity.

Capillary action (also referred to as capillarity, capillary motion, or wicking) is the ability of a liquid to flow in narrow spaces without the assistance of, or even in opposition to, external forces like gravity. The effect can be seen in the drawing up of liquids between the hairs of a paint-brush, in a thin tube, in porous materials such as paper and plaster, in some non-porous materials such as sand and liquefied carbon fiber, or in a cell. It occurs because of intermolecular forces between the liquid and surrounding solid surfaces. If the diameter of the tube is sufficiently small, then the combination of surface tension (which is caused by cohesion within the liquid) and adhesive forces between the liquid and container wall act to propel the liquid. The transitioning stud 16 allows for an electrical wire or stranded cable to terminate in a solid stud with no porosity or air path for liquids or gasses to pass through.

Figure 6:
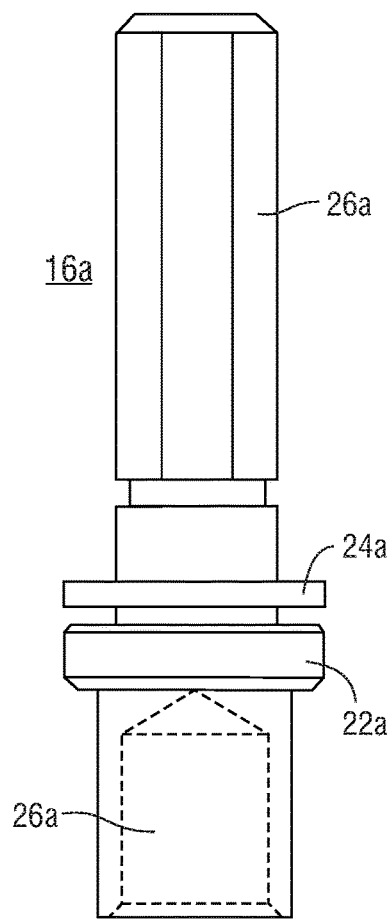
FIG. 6 is a side view of another embodiment of stud.
Figure 7:
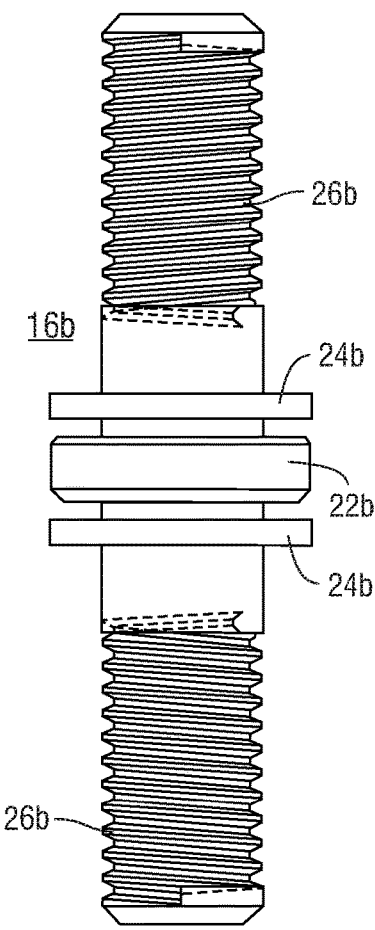
FIG. 7 is a side view of another embodiment of stud.

As shown, the stud 16 may have its second electrical connector 26 be threaded to allow a new connection to be attached but other combinations are possible. The stud 16a shown in FIG. 6 has two electrical connectors 26b one that is a crimping cavity as shown earlier with the other a smooth connector that may be inserted into another connection block or additional receiving cavity. The embodiment shown depicts a groove where a snap-ring may be used to secure the stud 16a. An optional flat spot may also be incorporated to allow a solid connection by way of set screws. FIG. 7 shows another embodiment of stud 16b that has electrical connectors 26b that are both threaded. The type of electrical connector may be varied by the particular application and it will be understood that all of those connector types are incorporated herein.

This invention has been described with reference to several preferred embodiments. Many modifications and alterations will occur to others upon reading and understanding the preceding specification. It is intended that the invention be construed as including all such alterations and modifications in so far as they come within the scope of the appended claims or the equivalents of these claims.

The invention claimed is:

1. A terminal block for transitioning an electrical connection between two distinct areas comprising:
    a block comprising a through hole, a sealing chamber within said block that surrounds said through hole, and a sealing device within said sealing chamber;
    a dielectric insert secured within said block such that said sealing device is compressed within said sealing chamber to cause said sealing device to form a seal between said block and said dielectric insert;
    said dielectric insert having at least one hole for receiving a stud (;) wherein each said hole comprises a through hole and a sealing chamber within said dielectric insert that surrounds said through hole; and
    a stud for each hole, each said stud comprising:
        a seal support flange and a sealing device;
        an electrical connector on each side of said seal support flange;
        said seal support flange is sized to fit within said sealing chamber and said sealing device is positioned between said support flange and said sealing chamber; and
    said stud is secured to said hole on an opposite side of said dielectric insert from said sealing chamber such that said support flange compresses said sealing device against said sealing chamber to cause said sealing device to fill a space of said sealing chamber and form a seal between said stud and said sealing chamber.

2. The terminal block of claim 1 in which said an electrical connector comprises one of a crimping cavity, a threaded end, a set screw, or a compression fit connection.

3. The terminal block of claim 1 further comprising said dielectric insert is made of Haysite or other epoxy impregnated fiberglass.

4. The terminal block of claim 1 further comprising said stud is made of an electrically conductive material such as copper or aluminum.

5. The terminal block of claim 1 further comprising said sealing device is made of a compressible and expandable material such as rubber, neoprene, or other elastomeric material.

6. The terminal block of claim 1 in which said stud is secured to said terminal block with a nut or a snap ring.

7. A stud for transitioning an electrical connection through a terminal block comprising a block and a dielectric insert sealed within said block that has at least one hole for receiving said stud, the hole comprising a through hole and a sealing chamber within said dielectric insert that surrounds the through hole, said stud comprising:
    a seal support flange and a sealing device;
    each side of said seal support flange comprises an electrical connector;
    said seal support flange is sized to fit within the sealing chamber and said sealing device is positioned between said support flange and the sealing chamber; and
    said stud is secured to the hole on an opposite side of said dielectric insert from the sealing chamber such that said support flange compresses said sealing device against said sealing chamber to cause said sealing device to fill a space of the sealing chamber and form a seal between said stud and the sealing chamber.

8. The stud of claim 7 in which said an electrical connector comprises one of a crimping cavity, a threaded end, a set screw, or a compression fit connection.

9. The stud of claim 7 further comprising said stud is made of an electrically conductive material such as copper or aluminum.

10. The stud of claim 7 further comprising said sealing device is made of a compressible and expandable material such as rubber, neoprene, or other elastomeric material.

11. The stud of claim 7 in which said stud is secured to said terminal block with a nut or a snap ring.

* * * * *